(12) United States Patent  
Ashurst et al.

(10) Patent No.: US 9,353,313 B2  
(45) Date of Patent: May 31, 2016

(54) MICRODEVICES AND METHODS OF MANUFACTURE

(71) Applicants: William Robert Ashurst, Auburn, AL (US); Virginia A. Davis, Auburn, AL (US); Christopher L. Kitchens, Easley, SC (US)

(72) Inventors: William Robert Ashurst, Auburn, AL (US); Virginia A. Davis, Auburn, AL (US); Christopher L. Kitchens, Easley, SC (US)

(73) Assignees: Auburn University, Auburn, AL (US); Clemson University, Clemson, SC (US)

( * ) Notice: Subject to any disclaimer, the term of this patent is extended or adjusted under 35 U.S.C. 154(b) by 270 days.

(21) Appl. No.: 13/963,709

(22) Filed: Aug. 9, 2013

(65) Prior Publication Data

US 2014/0044937 A1   Feb. 13, 2014

Related U.S. Application Data

(60) Provisional application No. 61/681,378, filed on Aug. 9, 2012.

(51) Int. Cl.

| | | |
|---|---|---|
| C09K 13/00 | (2006.01) | |
| C09K 19/02 | (2006.01) | |
| B81C 1/00 | (2006.01) | |
| B82Y 40/00 | (2011.01) | |
| C09K 19/34 | (2006.01) | |
| C09K 19/52 | (2006.01) | |

(52) U.S. Cl.
CPC ......... *C09K 19/3402* (2013.01); *B81C 1/00015* (2013.01); *B81C 1/00531* (2013.01); *B82Y 40/00* (2013.01); *C09K 13/00* (2013.01); *C09K 19/02* (2013.01); *B81C 1/0015* (2013.01); *B81C 1/00158* (2013.01); *B81C 1/00476* (2013.01); *B81C 1/00539* (2013.01); *B81C 2201/017* (2013.01); *C09K 2019/523* (2013.01); *Y10T 428/24851* (2015.01)

(58) Field of Classification Search
None  
See application file for complete search history.

(56) References Cited

U.S. PATENT DOCUMENTS

| | | | |
|---|---|---|---|
| 5,629,055 | A | 5/1997 | Revol et al. |
| 6,399,853 | B1 | 6/2002 | Roe et al. |
| 6,479,727 | B1 | 11/2002 | Roe |
| 6,610,440 | B1 | 8/2003 | LaFollette et al. |
| 6,706,234 | B2 | 3/2004 | Huang |
| 6,713,660 | B1 | 3/2004 | Roe et al. |

(Continued)

FOREIGN PATENT DOCUMENTS

EP   2428610 A1   3/2012

OTHER PUBLICATIONS

Kim et al., "Micro Transfer Printing on Cellulose Electro-Active Paper," Smart Materials and Structures, 2006, pp. 889-892.

(Continued)

*Primary Examiner* — Anita Alanko  
(74) *Attorney, Agent, or Firm* — Barnes & Thornburg LLP

(57) ABSTRACT

Illustrative embodiments of microdevices and methods of manufacturing such microdevices are disclosed. In at least one illustrative embodiment, a method of manufacturing one or more microdevices may include forming a liquid dispersion containing cellulose nanocrystals (CNC), depositing the liquid dispersion containing the CNC on a substrate, drying the liquid dispersion containing the CNC to form a solid film on the substrate, where the liquid dispersion contains a sufficient concentration of CNC to form a continuous solid film having a controlled microstructure, and processing the solid film to form the one or more microdevices on the substrate.

26 Claims, 5 Drawing Sheets

(56) References Cited

U.S. PATENT DOCUMENTS

| | | | |
|---|---|---|---|
| 7,144,654 B2 | 12/2006 | LaFollette et al. | |
| 7,166,384 B2 | 1/2007 | LaFollette et al. | |
| 7,299,711 B1 | 11/2007 | Linker et al. | |
| 7,351,430 B2 | 4/2008 | St. John et al. | |
| 7,368,151 B2 | 5/2008 | Souchay et al. | |
| 7,371,452 B2 | 5/2008 | Bourdelais et al. | |
| 7,373,819 B2 | 5/2008 | Engler et al. | |
| 7,375,404 B2 | 5/2008 | Park et al. | |
| 7,410,763 B2 | 8/2008 | Su et al. | |
| 7,442,339 B2 | 10/2008 | Sundararajan et al. | |
| 7,462,419 B2 | 12/2008 | LaFollette et al. | |
| 7,468,221 B2 | 12/2008 | LaFollette et al. | |
| 7,497,885 B2 | 3/2009 | Kollodge | |
| 7,501,069 B2 | 3/2009 | Liu et al. | |
| 7,547,886 B2 | 6/2009 | Mueller et al. | |
| 7,591,921 B2 | 9/2009 | Fukui et al. | |
| 7,776,021 B2 | 8/2010 | Borenstein et al. | |
| 7,826,127 B2 | 11/2010 | Khonsari et al. | |
| 7,910,230 B2 | 3/2011 | Souza et al. | |
| 7,947,094 B2 | 5/2011 | Fiebig | |
| 7,947,406 B2 | 5/2011 | Itou et al. | |
| 7,955,504 B1 * | 6/2011 | Jovanovic | B01D 61/18 210/321.71 |
| 7,964,390 B2 | 6/2011 | Rozakis et al. | |
| 7,967,929 B1 | 6/2011 | Stec, III et al. | |
| 7,968,646 B2 | 6/2011 | Laborie et al. | |
| 7,982,088 B2 | 7/2011 | Roe et al. | |
| 7,983,455 B2 | 7/2011 | Moise et al. | |
| 7,990,601 B2 | 8/2011 | Palmateer | |
| 8,004,053 B2 | 8/2011 | Miyagi et al. | |
| 8,058,145 B2 | 11/2011 | Tateishi et al. | |
| 8,062,841 B2 | 11/2011 | Su et al. | |
| 8,083,820 B2 | 12/2011 | Kollodge et al. | |
| 8,092,549 B2 | 1/2012 | Hillis et al. | |
| 8,097,456 B2 | 1/2012 | Borenstein et al. | |
| 8,105,430 B2 | 1/2012 | Boluk et al. | |
| 8,137,554 B2 | 3/2012 | Jovanovic et al. | |
| 8,158,728 B2 | 4/2012 | DeSimone et al. | |
| 8,160,695 B2 | 4/2012 | Dacey, Jr. et al. | |
| 8,173,215 B2 | 5/2012 | Sowinski et al. | |
| 8,182,839 B2 | 5/2012 | Engelhardt et al. | |
| 8,183,426 B2 | 5/2012 | Cole et al. | |
| 8,206,822 B2 | 6/2012 | Schlenoff | |
| 8,231,764 B2 | 7/2012 | Husband et al. | |
| 8,241,756 B2 | 8/2012 | Ankerfors et al. | |
| 8,398,901 B2 | 3/2013 | Beck et al. | |
| 8,652,636 B2 * | 2/2014 | Beck | C08B 15/08 106/163.01 |
| 2007/0125489 A1 * | 6/2007 | Paul | B29C 66/73921 156/272.8 |
| 2008/0108772 A1 | 5/2008 | Oksman et al. | |
| 2009/0211977 A1 * | 8/2009 | Miller | B01D 63/082 210/646 |
| 2010/0124651 A1 * | 5/2010 | Rousseau | B29C 41/28 428/304.4 |
| 2011/0045578 A1 | 2/2011 | Kawamata et al. | |
| 2011/0248214 A1 * | 10/2011 | MacLachlan | B01D 67/0048 252/299.01 |
| 2011/0293732 A1 | 12/2011 | Nachtkamp et al. | |
| 2012/0237750 A1 * | 9/2012 | Zou | B29C 41/24 428/221 |
| 2012/0313480 A1 | 12/2012 | Sinha et al. | |
| 2013/0264732 A1 * | 10/2013 | Youngblood | B29C 41/24 264/28 |
| 2013/0330417 A1 * | 12/2013 | Dong | A61L 15/44 424/618 |
| 2015/0017432 A1 * | 1/2015 | Shoseyov | C08L 1/04 428/336 |

OTHER PUBLICATIONS

Kim et al., "Cellulose Based Electro-Active Papers: Performance and Environmental Effects," Smart Materials and Structures, 2006, pp. 719-723.

Kim et al., "Discovery of Cellulose as a Smart Material," Macromolecules, 2006, pp. 4202-4206.

Kim et al., "Characterization of Electro-Active Paper Composite," Advances in Fracture and Strength, Parts 1-4, 2005, pp. 671-675.

Podsiadlo et al., "Molecularly Engineered Nanocomposites: Layer-by-Layer Assembly of Cellulose Nanocrystals," Biomacromolecules, 2005, pp. 2914-2918.

Wegner et al., "Advancing Cellulose-Based Nanotechnology," Cellulose, 2006, pp. 115-118.

Deshpande et al., "Studies on Conducting Polymer Electroactive Paper Actuators: Effect of Humidity and Electrode Thickness," Smart Materials and Structures, 2005, pp. 876-880.

Samir et al., "Review of Recent Research into Cellulosic Whiskers, Their Properties and Their Application in Nanocomposite Field," Biomacromolecules, 2005, pp. 612-626.

Green et al., "Modeling the Phase Behavior of Polydisperse Rigid Rods with Attractive Interactions with Applications to Single-Walled Carbon Nanotubes in Superacids," Journal of Chemical Physics, 2009, 11 pages.

Stroobants et al., "Liquid Crystal Phase Transitions in a Solution of Rodlike and Disklike Particles," J. Phys. Chem., 1984, pp. 3669-3674.

Stroobants et al., "Effect of Electrostatic Interaction on the Liquid-Crystal Phase-Transition in Solutions of Rodlike Polyelectrolytes," Macromolecules, 1986, pp. 2232-2238.

Onsager, L., "The Effects of Shape on the Interaction of Colloidal Particles," Annals of the New York Academy of Sciences, 1949, pp. 627-659.

Flory, P.J., "Phase Equilibria in Solutions of Rod-Like Particles," Proceedings of the Royal Society of London, Ser. A, 1956, pp. 73-89.

Wensink et al., "Isotropic-Nematic Phase Behavior of Length-Polydisperse Hard Rods," Journal of Chemical Physics, 2003, pp. 6868-6882.

Dong et al., "Effects of Ionic Strength on the Isotropic-Chiral Nematic Phase Transition of Suspensions of Cellulose Crystallites," Langmuir, 1996, pp. 2076-2082.

Davis, V.A., "Liquid Crystalline Assembly of Nanocylinders," Journal of Materials Research 2011, pp. 140-153.

Roman et al., "Effect of Sulfate Groups from Sulfuric Acid Hydrolysis on the Thermal Degradation Behavior of Bacterial Cellulose," Biomacromolecules, 2004, pp. 1671-1677.

Araki et al., "Flow Properties of Microcrystalline Cellulose Suspension Prepared by Acid Treatment of Native Cellulose," Colloids and Surfaces A: Physicochemical and Engineering Aspects, 1998, pp. 75-82.

Kayatin et al., "Viscoelasticity and Shear Stability of Single-Walled Carbon Nanotube/Unsaturated Polyester Resin Dispersions," Macromolecules, 2009, pp. 6624-6632.

Habibi et al., "Cellulose Nanocrystals: Chemistry, Self-Assembly, and Applications," Chemical Reviews vol. 110 (6), Feb. 23, 2010, pp. 3479-3500.

Nepal et al., "Strong Antimicrobial Coatings: Single-Walled Carbon Nanotubes Armored with Biopolymers," Nano Lett., 2008, pp. 1896-1901.

Ko et al., "Liquid-Crystalline Processing of Highly Oriented Carbon Nanotube Arrays for Thin-Film Transistors," Nano Letters, 2006, pp. 1443-1448.

Kiss et al., "Flow Induced Phenomena of Lyotropic Polymer Liquid Crystals: The Negative Normal Force Effect and Bands Perpendicular to Shear," Mechanical and Thermophysical Properties of Polymer Liquid Crystals, Brostow, W., ed., Chapman & Hall, London, 1998, pp. 342-406.

Durán, N. et al., "Review of Cellulose Nanocrystals Patents: Preparation, Composites and General Applications," Recent Patents on Nanotechnology vol. 12 (6), Jan. 2012, pp. 16-28.

Haywood et al., "Anisotropic Cellulose Nanocrystal Dispersions and Films for MEMS," Tuskegee Science and Technology Open House, Montgomery, AL, Apr. 2013, 1 page.

Haywood et al., "Preparation of Cellulose Nanocrystal Films for MEMS," 245th American Chemical Society National Meeting, New Orleans, LA, Apr. 2013, 6 pages.

(56) References Cited

OTHER PUBLICATIONS

Haywood et al., "Cellulose Nanocrystal Dispersions and Films for MEMS," Auburn University Research Week, Auburn, AL, Feb. 2013, 1 page.
Haywood et al., "Adapting MEMS Processing for Cellulose Nanocrystal Films," Engineering Research Showcase, Auburn, AL, Sep. 2012, 1 page.
Haywood et al., "Adapting MEMS Processing for Cellulose Nanocrystal Films," NSF CMMI Grantees Conference, Boston, MA, Jul. 2012, 1 page.
Kitchens, C., Abstract for "Collaborative Research: Processing and Properties of Cellulose Films for MEMS Applications," 2011, 2 pages.
Couderc et al., "Cellulose-Based Composite as a Raw Material for Flexible and Ultra-Lightweight Mechanical Switch Devices," IEEE, 2009, pp. 646-649.
Suresha et al., "Actuator, Sensor and MEMS Devices Based on Regenerated Cellulose," Composite Interfaces, vol. 15, No. 7-9, 2008, pp. 679-685.

* cited by examiner

MICRODEVICES AND METHODS OF MANUFACTURE

CROSS-REFERENCE TO RELATED APPLICATION

This application claims priority under 35 U.S.C. §119(e) to U.S. Provisional Patent Application Ser. No. 61/681,378, filed on Aug. 9, 2012, and entitled "Processing and Properties of Cellulose Films for MEMS Application," the entire disclosure of which is incorporated herein by reference.

STATEMENT REGARDING FEDERALLY SPONSORED RESEARCH

This invention was made with government support under Award Nos. 1130825 and 1131633 from the National Science Foundation. The government has certain rights in the invention.

BACKGROUND

A need exists for inexpensive, facile, abundant, renewable, and/or biodegradable alternatives to silicon. Silicon is facing increasing supply constraints due to the parallel growth of the microdevice and solar energy industries. In addition, silicon processing is generally regarded as expensive and environmentally detrimental, due to the fact that it requires energy intensive processing with harsh chemicals. These and other drawbacks make many potential "lab on a chip" applications (i.e., one time use or point of care devices) based on silicon technology cost prohibitive. To address some of the concerns with silicon processing, researchers have turned to polymeric substrates for micromachining. However, plastics that are amenable to micromachining tend to have challenging surface chemistries and/or other potential shortcomings.

SUMMARY

According to one aspect, a method of manufacturing one or more microdevices may comprise forming a liquid dispersion containing cellulose nanocrystals (CNC), depositing the liquid dispersion containing the CNC on a substrate, drying the liquid dispersion containing the CNC to form a solid film on the substrate, where the liquid dispersion contains a sufficient concentration of CNC to form a continuous solid film having a controlled microstructure, and processing the solid film to form the one or more microdevices on the substrate.

The liquid dispersion containing the CNC may have an isotropic microstructure. The liquid dispersion containing the CNC may have a biphasic microstructure. The controlled microstructure of the solid film may comprise one or more anisotropic domains and one or more isotropic domains. The liquid dispersion containing the CNC may have a liquid crystalline microstructure. The controlled microstructure of the solid film may comprise one or more anisotropic domains retained from the liquid crystalline microstructure of the liquid dispersion containing the CNC. The liquid crystalline microstructure of the liquid dispersion containing the CNC may be one of a nematic phase microstructure and a cholesteric phase microstructure.

The method may further comprise using at least one of liquid crystalline self-assembly, capillary-induced assembly, shear, gravity, and film casting without contact line pinning to control orientation of the CNC in at least one domain of the solid film. The method may further comprise tailoring a surface chemistry of the CNC to control at least one of a mechanical property, an electrical property, an optical property, and a biological property of the solid film.

Forming the liquid dispersion containing the CNC may comprise combining the CNC with a solvent that may be compatible with a photoresist. Depositing the liquid dispersion containing the CNC on the substrate may comprise depositing the liquid dispersion containing the CNC over a patterned layer of photoresist positioned on the substrate. The method may further comprise tailoring a surface chemistry of the layer of photoresist to improve a wettability of the layer of photoresist with the liquid dispersion containing the CNC.

Processing the solid film may comprise depositing a layer of photoresist over the solid film, patterning the layer of photoresist using photolithography, and etching portions of the solid film that are exposed through the patterned layer of photoresist. The method may further comprise tailoring a surface chemistry of the CNC to improve a wettability of the solid film with the layer of photoresist. Etching the portions of the solid film that are exposed through the patterned layer of photoresist may comprise exposing the portions of the solid film to an oxidizing plasma. At least a portion of the patterned layer of photoresist may remain after the portions of the solid film are completely etched by the oxidizing plasma.

Depositing the liquid dispersion containing the CNC on the substrate may comprise dip coating the substrate with the liquid dispersion containing the CNC. Drying the liquid dispersion containing the CNC may comprise orienting the substrate such that a gravitational force induces orientation in the CNC. Drying the liquid dispersion containing the CNC may comprise positioning the substrate in a directed gas stream to induce orientation in at least a portion of the CNC.

Depositing the liquid dispersion containing the CNC on the substrate may comprise spin coating the substrate with the liquid dispersion containing the CNC. The spin coating may induce orientation in at least a portion of the CNC. Depositing the liquid dispersion containing the CNC on the substrate may comprise doctor blade coating the substrate with the liquid dispersion containing the CNC. The doctor blade coating may exert a shear force that induces orientation in at least a portion of the CNC.

Drying the liquid dispersion containing the CNC may comprise applying a heat treatment. The solid film formed on the substrate may have an average thickness between about 0.1 micrometers and about 100 micrometers. An average roughness of the solid film may be less than about 500 nanometers.

At least one of a mechanical property, an electrical property, an optical property, and a biological property of at least one domain of the solid film may have a first value along a first direction that may be parallel to the substrate and a second value along a second direction that may be both parallel to the substrate and perpendicular to the first direction, the first value being different from the second value. At least one of a mechanical property, an electrical property, an optical property, and a biological property of the solid film may have a substantially constant value throughout at least one domain of the solid film.

According to another aspect, one or more microdevices may be formed on a substrate. Each of the one or more microdevices may comprise a body micromachined from a continuous film formed on the substrate, where the continuous film has a controlled microstructure of cellulose nanocrystals (CNC).

The controlled microstructure of the CNC may be an isotropic microstructure. The controlled microstructure of the CNC may comprise one or more anisotropic domains and one or more isotropic domains. The controlled microstructure of the CNC may comprise one or more anisotropic domains retained from a liquid crystalline microstructure of a liquid dispersion used to form the solid film. The CNC may have a tailored surface chemistry configured to control at least one of a mechanical property, an electrical property, an optical property, and a biological property of the one or more microdevices.

BRIEF DESCRIPTION OF THE DRAWINGS

The concepts described in the present disclosure are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. The detailed description particularly refers to the accompanying figures in which.

DETAILED DESCRIPTION OF THE DRAWINGS

Figure 1:
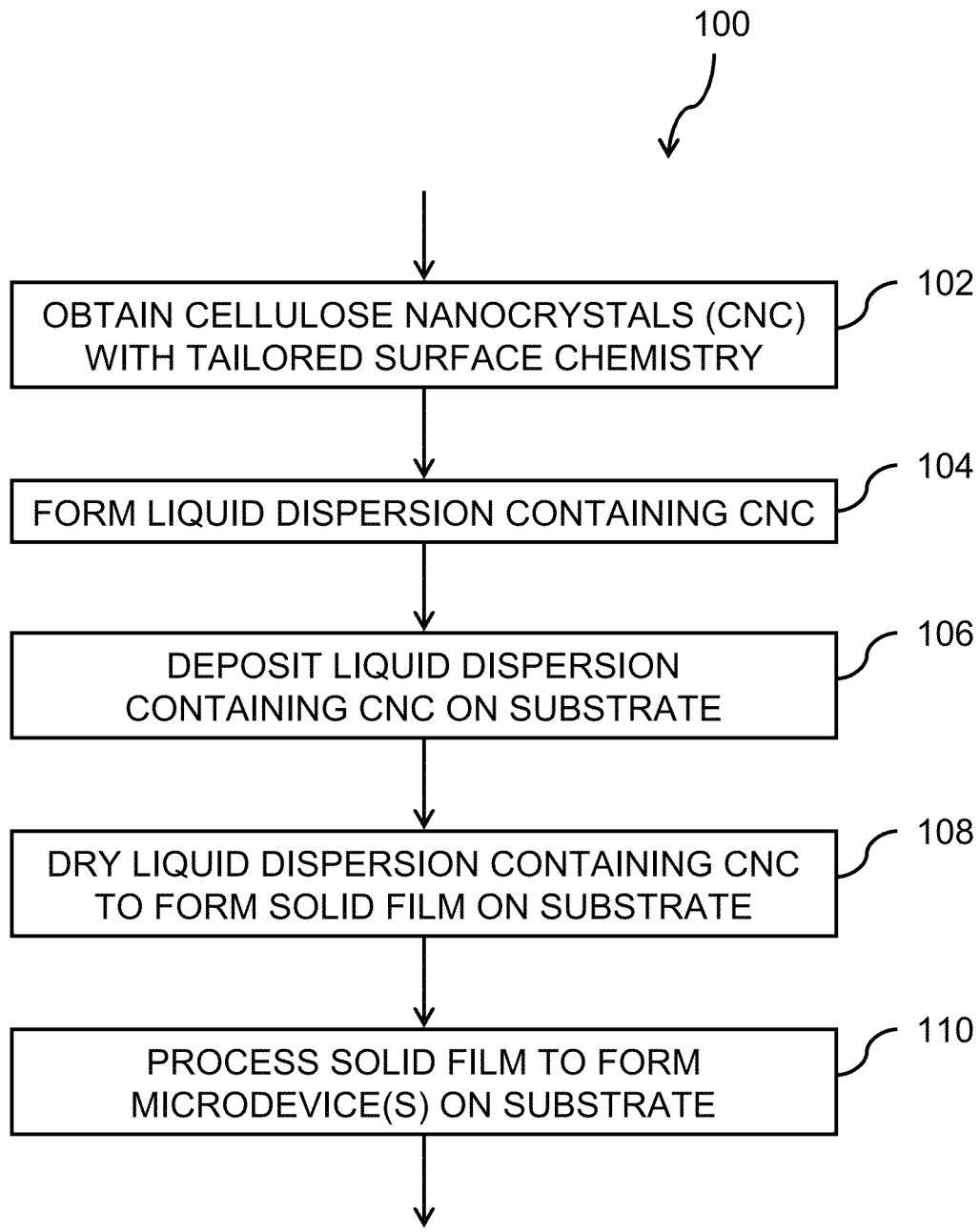
FIG. 1 is a simplified flow diagram of one illustrative embodiment of a method of manufacturing one or more microdevices.

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives falling within the spirit and scope of the present disclosure.

The present disclosure relates generally to methods of producing and processing cellulose nanocrystals (CNC) into films with tailored mechanical, electrical, optical, and/or biological properties suitable for micromachining to produce advanced microdevices. As used herein, "cellulose nanocrystals" (CNC) refers to any crystalline particles or fibers of cellulose, including, but not limited to, nanocrystalline cellulose, cellulose nanowhiskers, cellulose nanowires, and nanofibrilated cellulose. As used herein, "microdevices" refers to any devices formed by a process of surface micromachining, such as microelectromechanical systems/sensors (MEMS), micromechanical systems/sensors, microelectrical systems/sensors, and the like. Such microdevices generally include features on the order of about 0.1-100 micrometers.

As discussed further below, CNC films may provide several advantages over traditional microdevice materials (e.g., silicon). First, cellulose is the most abundant biopolymer on the planet. The surface chemistry of cellulose is similar to that of hydrophilic silicon oxide, with a CNC having numerous hydroxyl groups on its surface and typically being charged. Like single-walled nanotubes, CNC are a strong, low density material (typically having a bending strength of 10 GPa and Young's modulus of 150 GPa). However, the tailorable surface chemistry of CNC facilitates easier dispersion and processing than carbon nanotubes. Moreover, as further described below, the potential for alignment of CNC through liquid crystalline self-assembly, capillary-induced assembly, shear, gravity, and/or film casting without contact line pinning opens the possibility to make materials with anisotropic properties.

In summary, the controlled assembly of CNC described in the present disclosure may allow the use of CNC films as a relatively inexpensive alternative to electronic grade silicon for advanced microdevices and result in a transformative paradigm shift in microdevice materials and processing schemes. The present disclosure allows for fabrication schemes that are significantly less complex than previously established techniques, without sacrificing control over surface chemistry. In addition, CNC films may be produced with controlled alignment and smaller grain size than silicon. CNC-based microdevices may be less expensive and easier to produce than their silicon-based counterparts and have less environmental impact as a result of their fabrication.

Referring now to FIG. 1, one illustrative embodiment of a method 100 of manufacturing one or more microdevices is shown as a simplified flow diagram. In FIG. 1, the method 100 is illustrated as a number of blocks 102-110, each of which will be described in detail below. It will be appreciated that, in other embodiments, the method 100 may involve additional or different steps than those shown in FIG. 1.

The method 100 begins with block 102 in which CNC with a tailored surface chemistry are obtained. In particular, the CNC to be used in the subsequent steps of the method 100 may have a specific surface chemistry based on the process used to obtain the CNC from a cellulose source. By way of example, in some embodiments, block 102 may involve the acid catalyzed hydrolysis of amorphous cellulose (e.g., cotton Whatman ashless filter aid, wood pulp obtained from any pulp or paper process, or bacterial cellulose), possibly at elevated temperatures, followed by ultrasonication and repeated centrifugation/redispersion to remove excess acid and cellulosic byproducts. Variation in the cellulose source and in the method of CNC isolation may provide CNC of varying size, crystallinity, and surface chemistry, allowing the CNC to be tailored for different properties.

In one illustrative embodiment of block 102, cellulose fiber 200 from cotton may be subjected to sulfuric acid hydrolysis to produce CNC 202A having one particular surface chemistry (CNC-SA). In another illustrative embodiment, cellulose fiber 200 may be subjected to hydrochloric acid hydrolysis to produce CNC 202B having another particular surface chemistry (CNC-HCl). In yet another illustrative embodiment, cellulose fiber 200 may be subjected to combined hydrochloric and aceteic acid hydrolysis to produce CNC 202C having yet another particular surface chemistry (CNC-AA). It will be appreciated that, in still other embodiments, other methods and processes of CNC isolation from cellulose sources may be utilized in block 102 of the method 100.

Figure 2:
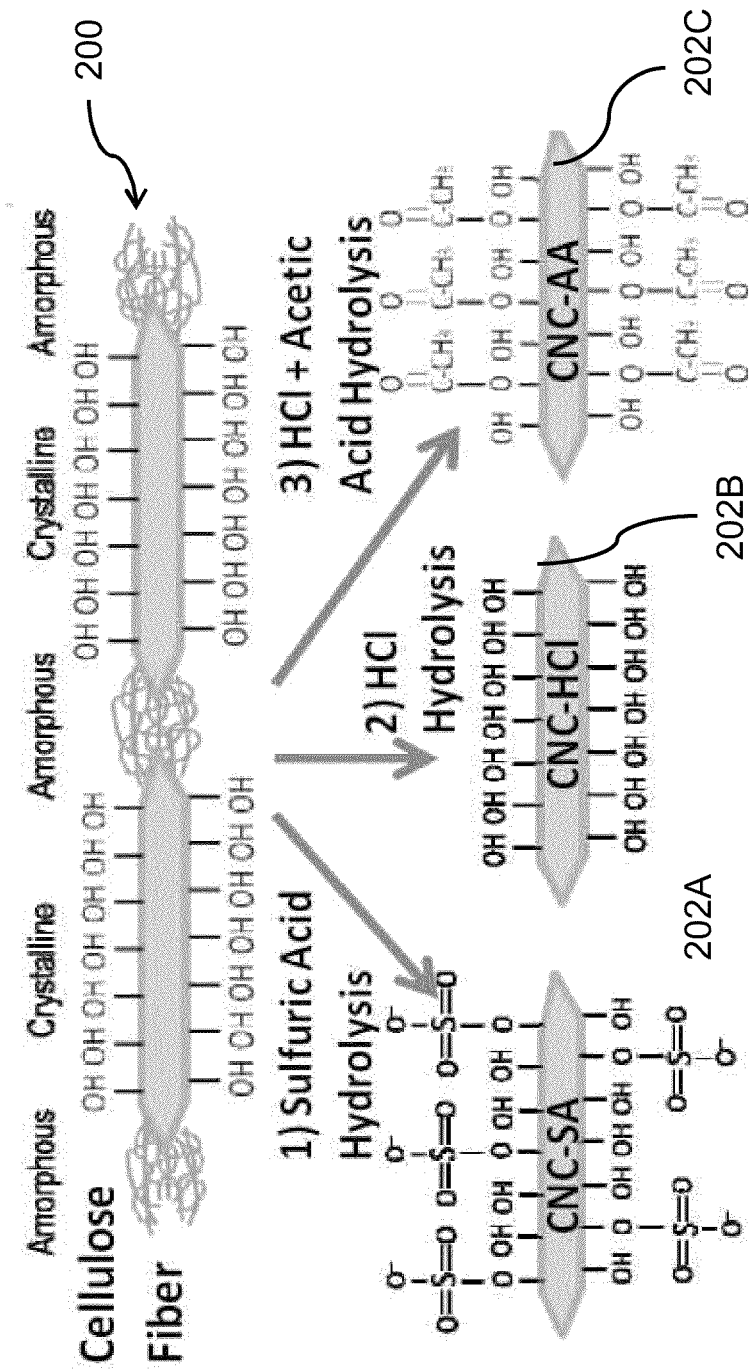
FIG. 2 shows three illustrative embodiments of cellulose nanocrystals (CNC) with tailored surface chemistry.

FIG. 2 illustrates exemplary surface chemistries of the CNC 202A-C. It is contemplated that any number of other processes may be used to produce CNC 202 having other specifically tailored surface chemistries. The particular surface chemistry of the CNC 202 obtained in block 102 may affect the mechanical, electrical, optical, and/or biological properties of the CNC film formed during the method 100. As such, the process used to obtain the CNC 202 in block 102 may be chosen to specifically tailor the surface chemistry of the CNC 202 to control one or more of the foregoing properties.

Figure 3A:
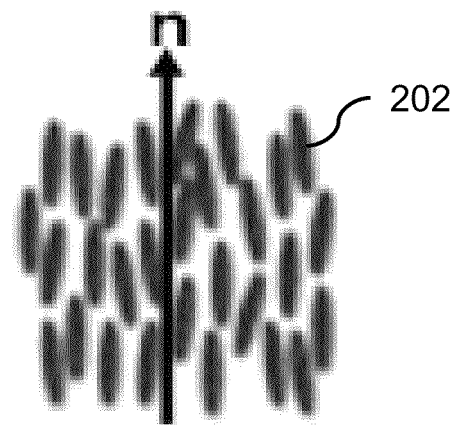
FIGS. 3A and 3B illustrate CNC arranged in a nematic phase liquid crystalline microstructure and a cholesteric phase liquid crystalline microstructure, respectively.
Figure 3B:
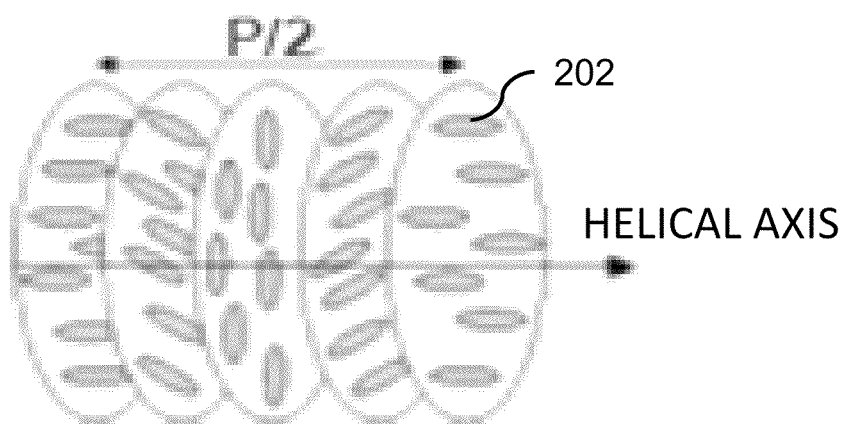

As illustrated in FIGS. 2, 3A, and 3B, the CNC 202 have a generally rod-like shape, the dimensions of which are controlled by the cellulose source 200 and the reaction conditions used in block 102. CNC 202 produced using the hydrolysis processes described above typically have an average length of about 107 nm (with a standard deviation of 55 nm), an average width of about 20.5 nm (with a standard deviation of 6.1 nm), and an average height of about 8.9 nm (with a standard deviation of 2.8 nm). As described further below, the dimensions and polydispersity of the CNC 202 may affect dispersion phase behavior.

After block 102, the method 100 proceeds to block 104 in which a liquid dispersion containing the CNC 202 is formed. As described further below, block 104 may involve combining the CNC 202 obtained in block 102 with a solvent that is that is compatible with a photoresist (to allow for deposition and processing of a solid film formed from the liquid dispersion). During block 104, the CNC 202 will typically follow the lyotropic liquid crystalline phase behavior expected for dispersions of rigid rods. In general, fluid dispersions of relatively rigid rod-like materials (such as CNC 202) form an isotropic phase at low concentrations. At a critical concentration ($\phi_I$) of CNC 202, a rod-rich phase of aligned liquid crystalline domains will form in equilibrium with the isotropic phase (i.e., the microstructure will be biphasic). The proportion of the liquid crystalline phase will increase with increasing concentration of CNC 202 until the dispersion becomes fully liquid crystalline at a critical concentration ($\phi_{LC}$) of CNC 202.

A number of different Friedelan classes are possible when the liquid dispersion containing the CNC 202 has a liquid crystalline microstructure. For instance, as shown in FIG. 3A, the liquid crystalline microstructure may be nematic phase, in which the CNC 202 are oriented along a direction n, with long-range orientational order but short-range positional order. In other embodiments, such as that shown in FIG. 3B, the liquid crystalline microstructure may be cholesteric phase, in which the nematic phase microstructure is twisted along a helical axis perpendicular to the director n (undergoing a full rotation at a pitch distance P). In some embodiments, the cholesteric phase may have a focal conic texture. In embodiments where the liquid crystalline microstructure is cholesteric phase, the application of a shear force may be used to "unwind" the cholesteric microstructure, increasing its pitch to the point that a nematic structure is formed. In still other embodiments, the liquid crystalline microstructure may be smectic phase, in which the CNC 202 have both long-range orientational and long-range positional order. It is contemplated that other phases and microstructures associated with lyotropic liquid crystals may also be formed.

In the illustrative embodiment, the liquid dispersion formed in block 104 may contain a sufficient concentration of CNC 202 to result in a continuous film having a controlled microstructure (when the liquid dispersion is deposited and dried on a substrate, as described further below with reference to blocks 106 and 108). For a particular CNC-solvent combination, the concentration of CNC 202 at which birefringent domains first form ($\phi_I$) and the concentration of CNC 202 at which no isotropic liquid remains ($\phi_{LC}$) may be determined using optical microscopy characterization. Temperature, solvent-CNC thermodynamic interactions, ionic strength, and shear may all influence whether the dispersion forms a nematic, precholesteric, or cholesteric phase microstructure. For example, one illustrative liquid dispersion of CNC-SA at 0.238 g/ml was found to exhibit a pre-cholesteric phase microstructure at 25° C. that transitioned to a cholesteric phase microstructure with a characteristic fingerprint texture at 50° C.

It is contemplated that any number of solvents, as well as other additives, may be used in forming the liquid dispersion containing the CNC 202 in block 104. By way of example, in some embodiments, CNC 202 (e.g., CNC-SA, CNC-HCl, CNC-AA, or other CNC) may be dispersed in an aqueous solution. In other embodiments of block 104, CNC 202 may be dispersed in an organic solvent. For instance, CNC-HCl or CNC-AA may be dispersed in a polar aprotic solvent (e.g., dimethyl sulfoxide (DMSO), tetrahydrofuran (THF), dioxane, and acetonitrile), a polar protic solvent (e.g., chloroform), or a non-polar solvent (e.g., hexane and toluene). It will be appreciated that, since the film preparation of method 100 is a relatively rapid process, true thermodynamic stability of the liquid dispersion is not a requirement. Rather, short term kinetic stability (on the order of minutes) should be sufficient for reproducible preparation of uniform films. Further enhancements in dispersibility may be achieved with the addition of a surfactant, such as decylamine, to the liquid dispersion formed in block 104. It will be appreciated that the solvent used to form the liquid dispersion in block 104 may also consider processability. For example, THF may be a preferable solvent to the more-stable DMSO, due to THF's lower boiling point that allows it to be more readily evaporated from the liquid dispersion in block 108.

Modification of the surface chemistry of the CNC 202 through covalent and non-covalent reactions and interactions may also occur in solution during block 104 (which may alter the phase behavior of the CNC 202, as well as the resulting film properties). Modifiable properties include, but are not limited to, rigidity, modulus, elasticity, conductivity, self-healing, and stimuli-responsiveness. These modification may be performed in aqueous or organic solutions, depending on the reaction chemistry used and the solubility of the surfactants, polymers, or other chemical moieties used. For example, in some embodiments, aqueous dispersions may be used where isolation of the CNC 202 was performed in aqueous media during block 102. Water also has the advantage of being compatible with many of the photoresists used in the fabrication of microdevices. In some embodiments, surface modification may be achieved through non-covalent interactions with the addition of surfactants, polymers, block co-polymers, amphiphilic molecules, and/or other multifunctional molecules to the liquid dispersion. Furthermore, in some embodiments, the liquid dispersion may contain an additive that can later be used to chemically crosslink or cure the solid film formed from the liquid dispersion (before, during, or after drying in block 108).

After block 104, the method 100 proceeds to block 106 in which the liquid dispersion containing the CNC 202 (formed in block 104) is deposited on a substrate. The substrate may be illustratively embodied as a handle wafer formed of silicon, glass, polished steel, certain plastics, or other suitable material(s). It is contemplated that any number of processes may be used to deposit the liquid dispersion containing the CNC 202 on the substrate in block 106. For example, in some embodiments, block 106 may involve dip coating the substrate with the liquid dispersion containing the CNC 202. Dip coating utilizes a relatively low shear and may be particularly suitable for low viscosity dispersions without a significant yield stress. In other embodiments, block 106 may involve spin coating the substrate with the liquid dispersion containing the CNC 202. The spin coating process will induce orientation in the CNC 202, which will be predominantly radial with some circumferential orientation along the edge of the deposited dispersion. It will be appreciated that the forces on the CNC 202 (and, hence, the degree of orientation) can be varied with the rotational speed of the spin coating process. In still other embodiments, block 106 may involve doctor blade coating the substrate with the liquid dispersion containing the CNC 202. The doctor blade coating process will exert a shear force on the liquid dispersion that will induce orientation in the CNC 202. For any of these coating processes, the deposition step of block 106 and the drying step of block 108 (described further below) may be repeated several times to achieve a film of desired thickness.

After block 106, the method 100 proceeds to block 108 in which the liquid dispersion containing the CNC 202 is dried to form a solid film on the substrate. As noted above, the liquid dispersion may contain a sufficient concentration of CNC 202 to form a continuous solid film having a controlled microstructure during block 108. In some embodiments, the controlled microstructure of the solid film may be an isotropic microstructure. In other embodiments, the controlled microstructure of the solid film may include one or more anisotropic domains and one or more isotropic domains. In some embodiments, the controlled microstructure of the solid film may include one or more anisotropic domains retained from the liquid crystalline microstructure of the liquid dispersion used to form the solid film. The CNC 202 in the one or more anistropic domains may have similar or different orientations to one another.

In some embodiments, block 108 may involve applying a heat treatment to the substrate along with the deposited liquid dispersion containing the CNC 202 to cause the solvent of the liquid dispersion to evaporate. In order for the solid film to exhibit the controlled microstructure, the solvent should be removed in a time scale shorter than the rotational relaxation time of the CNC 202. It will be appreciated that a greater degree of alignment in the CNC 202 can be achieved from a liquid dispersion with a biphasic microstructure rather than an isotropic microstructure, and even greater alignment can be achieved from a liquid dispersion with a liquid crystalline microstructure. In addition, retention of a cholesteric phase microstructure in the solid film may require relatively low shear rates during block 106 and/or block 108, because increasing shear rates may increase the pitch of the cholesteric microstructure until a uniformly aligned structure, such as a nematic microstructure, is achieved.

In some embodiments, particularly those where dip coating was used in block 106, block 108 may involve inducing orientation in at least a portion of the CNC 202 during drying and formation of the solid film. For instance, in some embodiments, block 108 may involve orienting the substrate (e.g., vertically) such that a gravitational force induces orientation in the CNC 202 during drying of the liquid dispersion containing the CNC 202. In other embodiments, block 108 may involve positioning the substrate in a directed gas stream to induce orientation in at least a portion of the CNC 202 during drying of the liquid dispersion containing the CNC 202.

Figure 4:
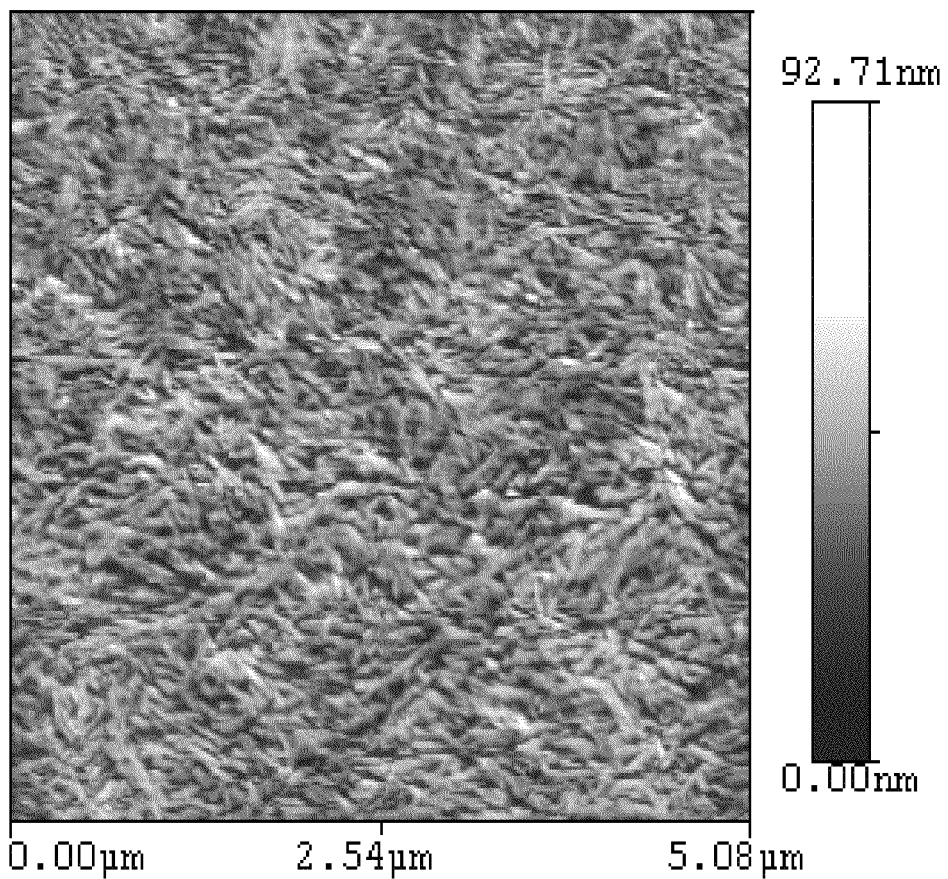
FIG. 4 is an atomic force microscopy (AFM) image of one illustrative embodiment of a solid film with RMS roughness of 38 nanometers formed using the method of FIG. 1.

The solid film formed on the substrate in block 108 may have a substantially uniform thickness (i.e., may be substantially smooth). For instance, in some embodiments, the average roughness of the solid film of this illustrative embodiment may be less than about 500 nanometers, using a root-mean-square (RMS) measure. In other illustrative embodiments, the average RMS roughness may be less than 100 nanometers, or less than 10 nanometers. An AFM image of one illustrative example of a solid film, having an average RMS roughness of 38 nanometers, formed using the method 100 is shown in FIG. 4. In some embodiments, the solid film formed on the substrate may have an average thickness between about 0.1 micrometers and about 100 micrometers. In one illustrative embodiment, the solid film formed on the substrate has an average thickness between about 3 micrometers and about 5 micrometers.

Figure 5A:
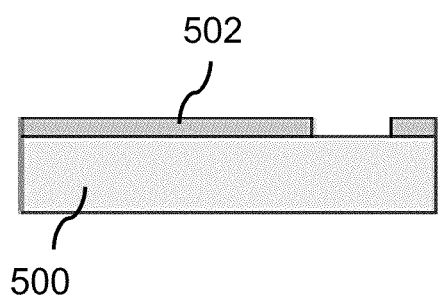
FIGS. 5A-E illustrate various stages of manufacture of one illustrative embodiment of a microdevice formed on a substrate.
Figure 5B:
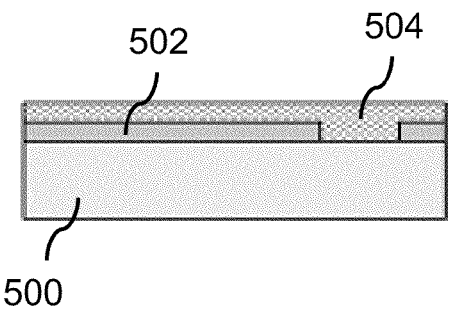

After block 108, the method proceeds to block 110 in which the solid film (formed in block 108) is processed to form one or more microdevices on the substrate. It is contemplated that block 110 may involve any number of micromachining techniques, such as photolithography and etching. It will be appreciated, however, that block 110 need not involve several of the more complicated fabrication techniques typically used with silicon, such as hydrofluoric acid etching or furnace depositions. One illustrative embodiment of the processing that may occur in block 110 of the method 100 is shown in FIGS. 5A-E (with FIGS. 5C-E specifically corresponding to block 110). FIG. 5A shows a patterned layer of photoresist 502 position on a substrate 500. In some embodiments of the method 100, block 106 may involve depositing the liquid dispersion containing the CNC 202 over such a patterned layer of photoresist 502. In such a case, the liquid dispersion containing the CNC 202 will contact the substrate 500 in certain areas (anchoring the resulting microdevice to the substrate) and will contact the patterned layer of photoresist 502 in other areas. In some embodiments, the surface chemistry of the patterned layer of photoresist 502 may be tailored to improve wettability of the photoresist 502 with the liquid dispersion containing the CNC 202. For instance, the photoresist 502 may be briefly exposed (e.g., for less than one minute) to an oxidizing plasma to increase the hydrophilicity of the photoresist 502. FIG. 5B illustrates a solid film 504 formed on the substrate 500 (and the patterned layer of photoresist 502) after the liquid dispersion containing the CNC 202 has been dried in block 108 of the method 100.

Figure 5C:
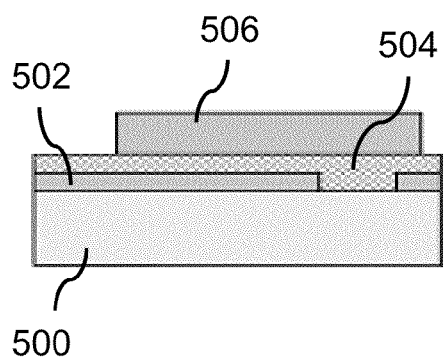
Figure 5D:
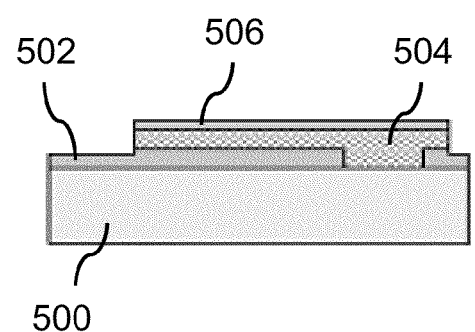
Figure 5E:
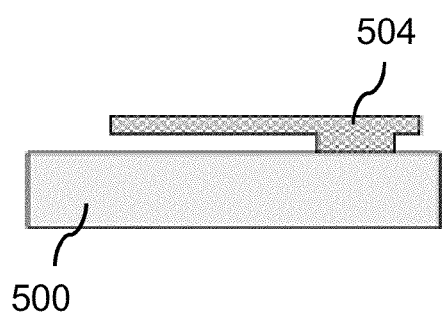

FIG. 5C shows another layer of photoresist 506 that has been deposited over the solid film 504. In some embodiments, the surface chemistry of the CNC 202 (used to form the solid film 504) may be tailored to improve a wettability of the solid film 504 with the photoresist 506. This layer of photoresist 506 has been patterned using photolithography, such that portions of the solid film 504 are exposed through the patterned layer of photoresist 506 (the leftmost and rightmost portions of the solid film 504 in FIG. 5C). FIG. 5D shows the structure resulting from etching of the portions of the solid film 504 that are were exposed through the patterned layer of photoresist 506. In some embodiments, an oxidizing plasma may be used to etch the exposed portions of the solid film 504. As the patterned layer of photoresist 506 will also typically be etched by the oxidizing plasma, the photoresist 506 should have sufficient thickness so that a portion of the patterned layer of photoresist 506 will remain after the portions of the solid film 504 are completely etched. For instance, where the etch rates of the solid film 504 and the photoresist 506 are similar, the thickness of the patterned layer of photoresist 506 may be at least as thick as the solid film 504. After etching of the solid film 504 is complete, the remaining photoresist 502, 506 may be stripped away to leave the body of the microdevice, as shown in FIG. 5E. While the microdevice shown in FIG. 5E is illustratively embodied as a micromechanical cantilever, it will be appreciated that any number of different microdevices may be formed during block 110 of the method 100, using similar processing to that described above. It will be appreciated that, in some embodiments, blocks 104-108 of the method 100 may be repeated, as necessary or desired, to form additional layers of solid film for manufacturing certain microdevices.

As noted above, the presently disclosed methods (such as the illustrative method 100) may utilize one or more of liquid crystalline self-assembly, capillary-induced assembly, shear, gravity, film casting without contact line pinning, and/or other methods to control the orientation of the CNC in at least a portion of the solid film. As such, the presently disclosed methods provide for the fabrication of a solid film with isotropic, anisotropic, and/or gradient properties. In some embodiments, the CNC of the solid film may be oriented or aligned in one or more domains such that the mechanical, electrical, optical, and/or biological properties of the solid film have differing values along two different directions (e.g., two perpendicular directions, both parallel to a surface of the substrate) or at two different locations. In other embodiments, where the CNC of the solid film are isotropic, one or more of the mechanical, electrical, optical, and/or biological properties of the solid film may be substantially constant throughout the film. In still other embodiments, the solid film may comprise multiple domains having different orientations and angle dependent properties.

Among other applications, anisotropic films may have unique benefits for micromechanical resonators (such as, by way of example, the cantilever of FIG. 5E). For instance, in one illustrative embodiment, a micromechanical resonator might be formed from an anisotropic film in which the orientation of the CNC created differing mechanical stiffness in different directions, such that in-line stiffness of the resonator was low (increasing signal transduction and allowing the primary oscillation mode to dominate the motion), while lateral stiffness of the resonator was high (avoiding higher order oscillation modes). Furthermore, lower bending moments in the bending direction of the resonator might reduce actuation voltages, while increased stiffness in non-bending directions might help to reduce the critical dimension and device size (resulting in more microdevices per wafer and, hence, lower cost per microdevice).

The presently disclosed methods (such as the illustrative method 100) also allow unique tailoring of the mechanical, electrical, optical, and/or biological properties of the solid film and/or the resulting microdevice(s). For instance, as discussed above, a surface chemistry of the CNC may be tailored to control one or more of the foregoing properties of the solid film containing the CNC. Alternatively or additionally, one or more components might be added to the liquid dispersion containing the CNC to affect the mechanical, electrical, optical, and/or biological properties of the solid film formed from the liquid dispersion. Similarly, one or more components might be attached directly to the microdevice (after its formation from the solid film) to affect the mechanical, electrical, optical, and/or biological properties of the microdevice. For instance, a semiconductor component, a metallic component, a polymeric component, and/or a biological reagent (e.g., an enzyme or ligand) might be attached to the microdevice to improve its performance (e.g., the sensing response of the microdevice).

While certain illustrative embodiments have been described in detail in the figures and the foregoing description, such an illustration and description is to be considered as exemplary and not restrictive in character, it being understood that only illustrative embodiments have been shown and described and that all changes and modifications that come within the spirit of the disclosure are desired to be protected. There are a plurality of advantages of the present disclosure arising from the various features of the apparatus, systems, and methods described herein. It will be noted that alternative embodiments of the apparatus, systems, and methods of the present disclosure may not include all of the features described yet still benefit from at least some of the advantages of such features. Those of ordinary skill in the art may readily devise their own implementations of the apparatus, systems, and methods that incorporate one or more of the features of the present disclosure.

The invention claimed is:

1. A method of manufacturing one or more microdevices, the method comprising:
   forming a liquid dispersion containing cellulose nanocrystals (CNC);
   depositing the liquid dispersion containing the CNC on a substrate;
   drying the liquid dispersion containing the CNC to form a solid film on the substrate, wherein the liquid dispersion contains a sufficient concentration of CNC to form a continuous solid film having a controlled microstructure; and
   processing the solid film to form the one or more microdevices on the substrate.

2. The method of claim 1, wherein the liquid dispersion containing the CNC has an isotropic microstructure.

3. The method of claim 1, wherein the liquid dispersion containing the CNC has a biphasic microstructure.

4. The method of claim 3, wherein the controlled microstructure of the solid film comprises one or more anisotropic domains and one or more isotropic domains.

5. The method of claim 1, wherein the liquid dispersion containing the CNC has a liquid crystalline microstructure.

6. The method of claim 5, wherein the controlled microstructure of the solid film comprises one or more anisotropic domains retained from the liquid crystalline microstructure of the liquid dispersion containing the CNC.

7. The method of claim 6, wherein the liquid crystalline microstructure of the liquid dispersion containing the CNC is one of a nematic phase microstructure and a cholesteric phase microstructure.

8. The method of claim 1, further comprising using at least one of liquid crystalline self-assembly, capillary-induced assembly, shear, gravity, and film casting without contact line pinning to control orientation of the CNC in at least one domain of the solid film.

9. The method of claim 1, further comprising tailoring a surface chemistry of the CNC to control at least one of a mechanical property, an electrical property, an optical property, and a biological property of the solid film.

10. The method of claim 1, wherein forming the liquid dispersion containing the CNC comprises combining the CNC with a solvent that is compatible with a photoresist.

11. The method of claim 1, wherein depositing the liquid dispersion containing the CNC on the substrate comprises depositing the liquid dispersion containing the CNC over a patterned layer of photoresist positioned on the substrate.

12. The method of claim 11, further comprising tailoring a surface chemistry of the layer of photoresist to improve a wettability of the layer of photoresist with the liquid dispersion containing the CNC.

13. The method of claim 1, wherein processing the solid film comprises:
   depositing a layer of photoresist over the solid film;
   patterning the layer of photoresist using photolithography; and
   etching portions of the solid film that are exposed through the patterned layer of photoresist.

14. The method of claim 13, further comprising tailoring a surface chemistry of the CNC to improve a wettability of the solid film with the layer of photoresist.

15. The method of claim 13, wherein etching the portions of the solid film that are exposed through the patterned layer of photoresist comprises exposing the portions of the solid film to an oxidizing plasma.

16. The method of claim 15, wherein at least a portion of the patterned layer of photoresist remains after the portions of the solid film are completely etched by the oxidizing plasma.

17. The method of claim 1, wherein depositing the liquid dispersion containing the CNC on the substrate comprises dip coating the substrate with the liquid dispersion containing the CNC.

18. The method of claim 17, wherein drying the liquid dispersion containing the CNC comprises orienting the substrate such that a gravitational force induces orientation in the CNC.

19. The method of claim 17, wherein drying the liquid dispersion containing the CNC comprises positioning the substrate in a directed gas stream to induce orientation in at least a portion of the CNC.

20. The method of claim 1, wherein depositing the liquid dispersion containing the CNC on the substrate comprises spin coating the substrate with the liquid dispersion containing the CNC, the spin coating inducing orientation in at least a portion of the CNC.

21. The method of claim 1, wherein depositing the liquid dispersion containing the CNC on the substrate comprises doctor blade coating the substrate with the liquid dispersion containing the CNC, the doctor blade coating exerting a shear force that induces orientation in at least a portion of the CNC.

22. The method of claim 1, wherein drying the liquid dispersion containing the CNC comprises applying a heat treatment.

23. The method of claim 1, wherein the solid film formed on the substrate has an average thickness between about 0.1 micrometers and about 100 micrometers.

24. The method of claim 23, wherein an average roughness of the solid film is less than about 500 nanometers.

25. The method of claim 1, wherein at least one of a mechanical property, an electrical property, an optical property, and a biological property of at least one domain of the solid film has a first value along a first direction that is parallel to the substrate and a second value along a second direction that is both parallel to the substrate and perpendicular to the first direction, the first value being different from the second value.

26. The method of claim 1, wherein at least one of a mechanical property, an electrical property, an optical property, and a biological property of the solid film has a substantially constant value throughout at least one domain of the solid film.

* * * * *